US006967453B2

United States Patent
Miettinen

(10) Patent No.: US 6,967,453 B2
(45) Date of Patent: Nov. 22, 2005

(54) METHOD AND APPARATUS FOR CONTROLLING FAN MOTOR

(75) Inventor: Erkki Miettinen, Helsinki (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 10/503,073

(22) PCT Filed: Mar. 5, 2003

(86) PCT No.: PCT/FI03/00167

§ 371 (c)(1),
(2), (4) Date: Sep. 23, 2004

(87) PCT Pub. No.: WO03/075447

PCT Pub. Date: Sep. 12, 2003

(65) Prior Publication Data

US 2005/0099147 A1   May 12, 2005

(30) Foreign Application Priority Data

Mar. 7, 2002 (FI) .................................. 20020439

(51) Int. Cl.[7] .............................................. H02P 7/29
(52) U.S. Cl. ...................................... 318/471; 318/807
(58) Field of Search ................................ 318/138, 254, 318/439, 471–473, 720–724, 798–803, 807–817

(56) References Cited

U.S. PATENT DOCUMENTS

| | | | | |
|---|---|---|---|---|
| 4,763,347 A | * | 8/1988 | Erdman | 318/254 |
| RE35,124 E | * | 12/1995 | Erdman et al. | 318/599 |
| 6,118,239 A | | 9/2000 | Kadah | |
| 6,211,635 B1 | * | 4/2001 | Kambe et al. | 318/254 |
| 6,262,549 B1 | * | 7/2001 | Yang et al. | 318/463 |
| 6,316,895 B1 | | 11/2001 | Ramarathnam | |

FOREIGN PATENT DOCUMENTS

GB  2 121 557  12/1983

\* cited by examiner

*Primary Examiner*—Bentsu Ro
(74) *Attorney, Agent, or Firm*—Dykema Gossett PLLC

(57) ABSTRACT

A method and an apparatus for controlling a fan motor which is arranged to arranged to cool an object to be cooled and to be controlled by an inverter whose output is connected to the fan motor. The method of the invention comprises steps of determining the temperature of the object to be cooled or a variable proportional to the temperature to form a control variable, controlling the frequency of the inverter output voltage on the basis of the control variable, and controlling the effective value of the inverter output voltage on the basis of the control variable.

12 Claims, 3 Drawing Sheets

US 6,967,453 B2

METHOD AND APPARATUS FOR CONTROLLING FAN MOTOR

BACKGROUND OF THE INVENTION

The invention relates to a method and apparatus for controlling a fan motor according to the preambles of the independent claims.

In the cooling of devices with a high dissipation power, it is common to use fans which generate air movement which is used to transfer heat away from the object producing it. For example, centrifugal fans provided with an induction motor implemented by an external rotor are employed in cooling due to their efficiency, simplicity and affordability. The rotation speed of such machines provided with external rotors can typically adjusted to a speed lower than the nominal speed by changing the effective value of supply voltage either by a transformer or a thyristor clipper. The nominal rotation speed cannot, however, be increased since the supply network frequency determines the synchronous speed of the induction motor. Furthermore, commercially available variable transformers and thyristor clippers are relatively expensive components in proportion to the fan price. In addition, these speed control devices can be operated only manually, which limits their use and practicability.

External rotor fans are often connected to a supply network without any control device, in which case their intake power is constant regardless of the real cooling demand. Cooling fans are typically used 24 hours in a day, and thus the energy consumption is maximal with respect to the cooling demand.

U.S. Pat. No. 5,963,887 discloses a cooling solution where the rotation speed of a fan is controlled according to the temperature of the object to be cooled by determining certain operating points for the rotation speed of the fan. This kind of use restricts the controllability of the fan in an undesired manner.

BRIEF DESCRIPTION OF THE INVENTION

The object of the invention is to provide a method which avoids the above-mentioned drawbacks and enables controlling of a fan motor in a more economical manner and by a simpler apparatus. This object is achieved by a method of the invention which is characterized by what is disclosed in the characterizing part of independent claim 1.

The method according to the invention is based on the idea that the motor of a fan is controlled according to a control variable to be determined, which is for example the temperature of the object to be cooled down or another variable influencing it. The motor is controlled by changing the frequency and the effective value of the voltage to be fed to the motor. The solution according to the invention provides advantages in terms of costs since the fan motor is controlled in a controlled manner according to the need. Since the control is implemented by changing both the effective value and frequency of voltage, the control will be very reliable and can be implemented by a simple apparatus.

Furthermore, thanks to the separated control of the voltage and the frequency, the field weakening point of the fan motor can be controlled to a higher rotation speed than what can be achieved by a normal network frequency. This means that the fan provides more power although the phase current does not exceed the nominal value.

The invention also relates to an apparatus for controlling a fan motor. The apparatus of the invention is characterized by what is disclosed in the characterizing part of independent claim 7.

Using apparatus of this kind, the advantages provided by the method of the invention can be achieved by means of a simple and economical structure.

BRIEF DESCRIPTION OF THE DRAWINGS

The invention will now be described in greater detail by preferred embodiments with reference to the accompanying drawings, in which.

DETAILED DESCRIPTION OF THE INVENTION

Figure 1:
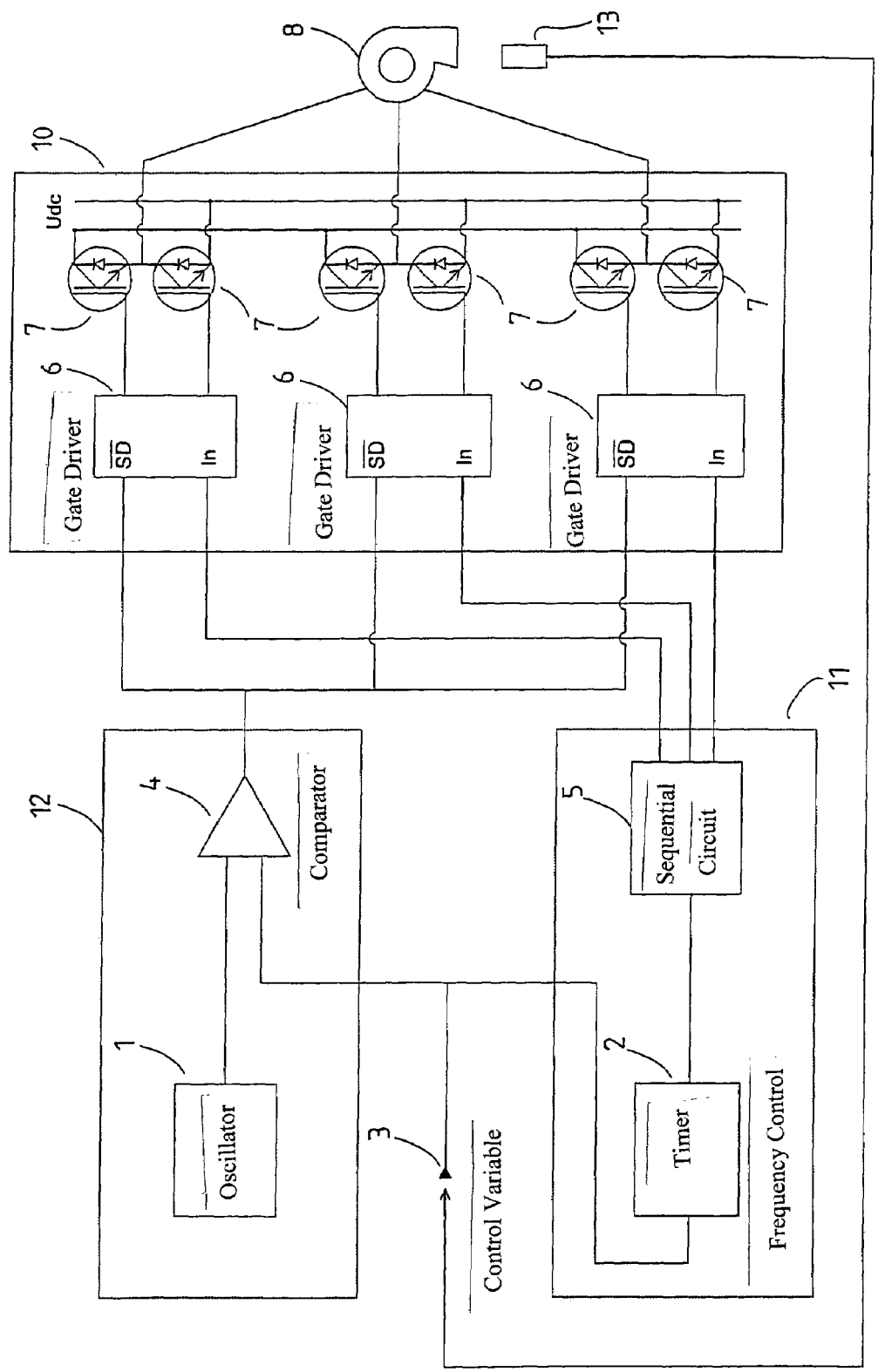
FIG. 1 is a block diagram illustrating an apparatus according to the invention.

FIG. 1 is a block diagram illustrating an apparatus according to the invention. In terms of functionality, the apparatus of the invention can be deemed to consist of three main parts. These are an inverter part 10 which generates motor voltage, a part 11 which controls the frequency of the voltage to be fed to the motor and a part 12 which controls the effective value of the voltage to be fed to the motor. In the figure, the inverter part 10 is illustrated as a three-phase inverter. Typically, the inverter part consists of a bridge circuit formed by power switches 7 and their zero diodes, of a direct voltage intermediate circuit Udc and means which control the power switches and are most preferably gate drivers.

The apparatus according to the invention comprises means for forming a control variable on the basis of the temperature of the object to be cooled or a variable proportional to the temperature. At their simplest, the means for forming a control variable include a component which is responsive to the temperature and whose electric properties change as the temperature changes. Such a component is, for example, an NTC resistor 13 whose resistance magnitude changes with the temperature. In that case, the resistance of the resistor or voltage acting over it functions as the control variable. FIG. 1 illustrates the NTC resistor and its connection to an input 3 in the block diagram. In a practical embodiment, the NTC resistor can be arranged in the cooling ribs of the object to be cooled, for instance. One alternative for forming the control variable is to implement it on the basis of a thermal model drafted from the power component. When this kind of model is used, the temperature of a component can be reliably reduced in real time when the component load is known.

According to the method of the invention, the temperature of the object to be cooled or a variable proportional to the temperature is determined. The control variable can also be formed on the basis of a variable proportional to the temperature. In that case, the control variable is determined on the basis of the current or another electric property of the object to be cooled, for instance. For example, if the object to be cooled is a frequency converter, it is clear that the temperature of the frequency converter increases as the load increases. In that case, an increase in the frequency converter current indicates that the temperature has increased, and the amount of current consumed by the object to be cooled can be used as a control variable in the apparatus and method according to the invention. An alternative variable proportional to the temperature for obtaining the control variable is the output power produced by the object to be cooled. If the object to be cooled is a frequency converter, the variable proportional to the temperature can also be derived directly from the control information on the inverter. In that case, the object to be cooled does not need to be provided with means for performing the actual measurement. Any piece of control information known to have an effect on heating of the object to be cooled can function as the basis of the control variable. This kind of control information may be, for example, information on the generated torque or current. The control variable can naturally also be implemented as a combination of various pieces of control information.

The apparatus according to the invention further comprises means 11 for controlling the frequency of the voltage of the inverter 10 output on the basis of the control variable. FIG. 1 illustrates how the control variable is fed to the input 3, from which the control variable is fed to the means 11 for controlling frequency. The frequency control means 11 preferably include means 2 for forming a pulse sequence and means 5 for forming phase-specific switching sequences. The frequency control means can be used according to the method of the invention to control the frequency of the inverter output voltage on the basis of the control variable.

The means 2 for forming a pulse sequence may be, for example, a commonly used LM555 timer circuit manufactured by National Semi-conductor, or another suitable circuit which generates a pulse sequence. It is simple to implement generation of a pulse sequence by means of the LM555 timer. The means 2 are preferably such that the pulse ratio of the pulse sequence to be generated is substantially one and the frequency of the pulse sequence is responsive to the control variable.

The features of the LM555 timer include generation of a pulse sequence using simple switching, the features of the pulse sequence being determinable by components connected to the timer. In the solution of the invention, the timer is coupled to form an astable multivibrator. According to the invention, the timer generates a pulse sequence whose pulse ratio is one. In that case, the pulses of the pulse sequence are up and down for an equally long duration.

Figure 3:
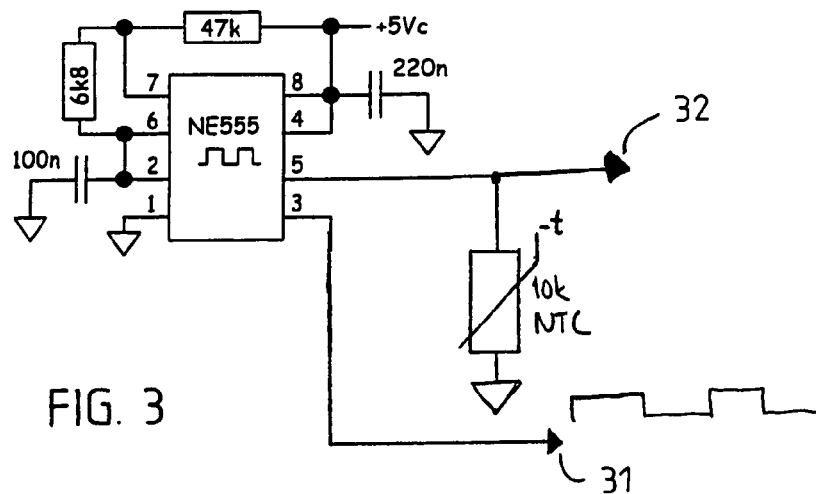
FIG. 3 illustrates an exemplary embodiment of means for generating a pulse sequence.

Since the object is to generate a pulse sequence whose frequency depends on the control variable, the control variable is connected to the means which form the pulse sequence. According to a preferred embodiment of the invention, the control variable is formed using a resistor responsive to the temperature. In that case, the resistor concerned is used as one component which influences the frequency of the pulse sequence in the timer circuit that generates the pulse sequence. FIG. 3 shows an exemplary embodiment of a circuit which generates a pulse sequence whose frequency is proportional to the control variable. In the circuit shown the temperature influences the frequency of the pulse sequence obtained from output 31 through the NTC resistor.

According to a preferred embodiment of the invention, the motor to be controlled has three phases, and thus a three-phase voltage should be supplied to it. The means 2 generate only one pulse sequence whose frequency is responsive to the control variable. According to a preferred embodiment, the means for producing phase-specific switching sequences also comprise means 5 for forming phase-specific switching sequences from the generated pulse sequence. From the produced pulse sequence, these means generate three pulse sequences whose phase is shifted by 120° with respect to each other. This results in three pulse sequences with the same phase shift with respect to each other and the same pulse pattern. Such phase-specific switching sequences can thus be used as switching instructions for operating the motor. As such, the switching sequences form normal "six step" control.

Figure 4:
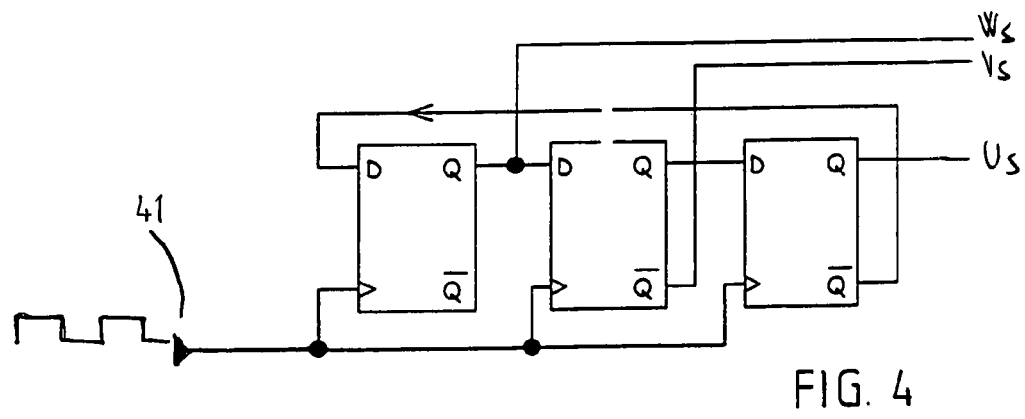
FIG. 4 illustrates an exemplary embodiment of means for forming phase-specific switching sequences.
Figure 6:
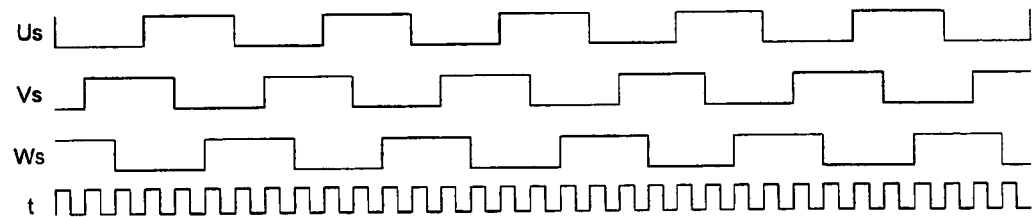
FIG. 6 illustrates phase-specific switching sequences.

The switching sequences can be produced by a three-phase generator made of three D flip-flops, for instance. In that case, the maximum value of the frequency of the pulse sequence to be fed to the three-phase generator has to be six times greater than the maximum value of the desired output frequency. The reason for this is that the D flip-flops generally change their states at the ascending edge of the input signal. Since the state of each phase changes twice during a sequence in a three-phase system, the input signal has to have six ascending edges during one signal sequence to be produced. An exemplary embodiment of switching which provides a three-phase sequence is shown in FIG. 4. A signal produced in proportion to the temperature is supplied to output 41 and desired phase-specific switching sequences are obtained as output Us, Vs, Ws. FIG. 6 correspondingly shows three-phase signals Us, Vs, Ws and signal t which is produced by the means 2 and has a frequency six times higher than that of the three-phase signals.

The apparatus according to the invention further comprises means 12 for controlling the effective value of the inverter output voltage by means of the control variable. According to the method of the invention, the effective value of the inverter output voltage can be controlled by the means 12. FIG. 1 shows how a control variable connected to the output 3 is supplied to the voltage control means 12. The voltage control means comprise pulse width modulation circuits, which include an oscillator circuit 1 and a comparator circuit 4. In the solution according to the invention, the oscillator circuit produces a triangular wave or a curve form resembling it. This curve form is fed to one input of the comparator circuit 4. A control variable which is proportional to the temperature of the object to be cooled as described above and has been produced by a temperature sensitive resistor is fed to the other input of the comparator circuit. In that case, the control variable is control voltage proportional to the temperature. Control voltage of this kind is obtained from the output pole 32 of FIG. 3, for example.

Figure 2:
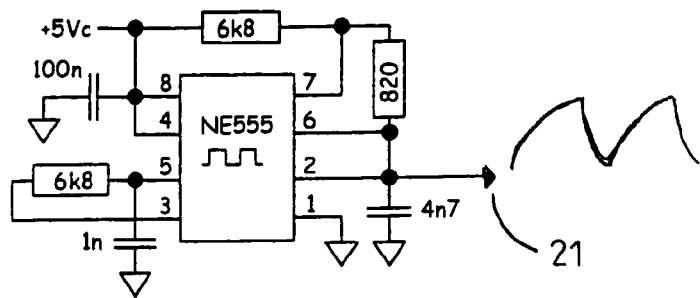
FIG. 2 illustrates an exemplary embodiment of an oscillator circuit which produces a triangular signal.

The level of the triangular wave produced by the oscillator circuit 1 can be changed by component choices so that the triangular waves are located between certain voltage limits. The oscillator circuit can be implemented using an NE555 timer circuit, for example, and discrete components connected thereto by means of which the signal level and frequency can be controlled as desired. For example, 15 kHz can be selected as the frequency of the triangular wave used in pulse width modulation. FIG. 2 illustrates an exemplary solution of a circuit which produces a triangular wave for the output pole 21.

The comparator circuit 4 compares the voltages fed to its inputs and changes the state of its output on the basis of the comparison. Signals arriving at the comparator are fed to the comparator so that the comparator output is up if the control variable is smaller than the triangular wave. Correspondingly, the comparator output is down if the control voltage is greater than the triangular wave. As appears from FIG. 1, the comparator output is connected to means 6 for controlling switching components. According to a preferred embodiment of the invention, these means are gate drivers, which are used to control the switches of the inverter part. They also influence the control of the voltage effective value together with the above-mentioned comparator circuit.

Figure 7:
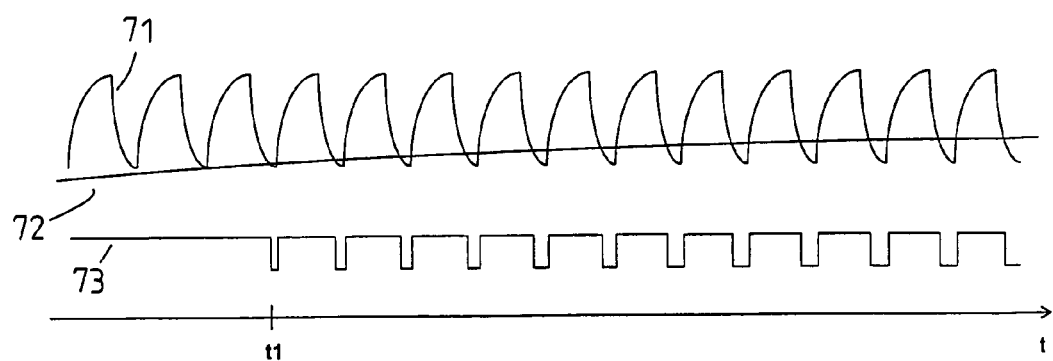
FIG. 7 exemplifies signals fed to inputs of a comparator circuit and an output of the comparator circuit.

FIG. 7 exemplifies the curve forms of the signals to be fed to the comparator circuit and the comparator output with these curve forms. In the figure, signal 71 is the output signal of the oscillator circuit that generates a triangular wave form and signal 72 is a control variable, which in the figure is the control voltage. Curve from 73 is obtained as a result of the comparison performed by the comparator.

The apparatus of the invention further comprises an inverter part, as described above. The inverter is used to generate three-phase voltage for the phase conductors of the motor by connecting the phase conductors alternately to the plus and the minus bus of the voltage circuit, between which there acts voltage Udc. Nowadays IGB transistors are commonly used as power switches in the inverter part due to their good properties. The gates of the IGB transistors are controlled by devices 6 which have been formed for this purpose but which are also commercially available. The control of IGB transistors by such gate drivers can be implemented in a simple manner. The gate driver employed in the solution according to the invention may be an IR2184 component manufactured by International Rectifier, for instance. Both switching components of one phase can be controlled by component of this kind, i.e. the IGB transistor of both the upper and the lower branch of a bridge connection, in which case one gate driver circuit is needed for each phase in a three-phase device. The IGB transistors are switched in the usual manner so that they can be controlled by the gate driver.

Figure 5:
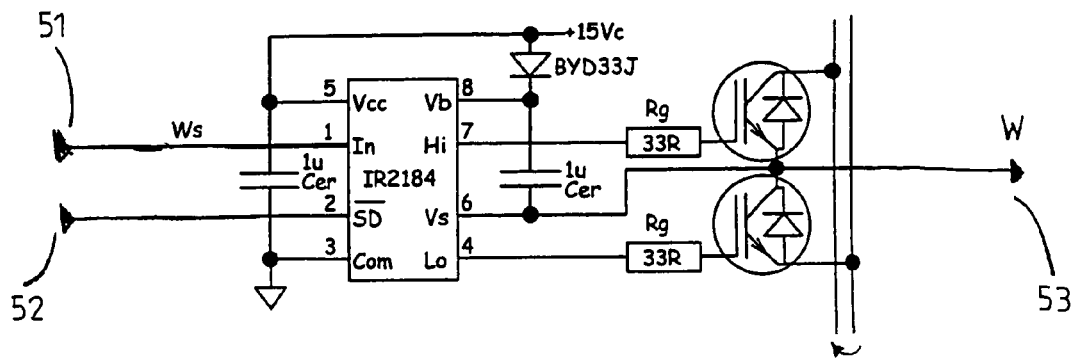
FIG. 5 illustrates an exemplary embodiment of one phase of an inverter part.

The above-mentioned gate driver IR2184 has two input poles, as shown in FIG. 5 in respect of one phase. The first one In of the input poles closes either the upper or the lower switch and the second one $\overline{SD}$ opens both switches at the zero level. The signals fed to the first control pole cause transition of one switch to a conductive state and correspondingly transition of the other switch to a non-conductive state as follows, for example: when the signal to be fed is up, the upper switch is conductive and the lower switch is in the non-conductive state. Correspondingly, when the signal fed to the first control pole is down, the lower switch is conductive and the upper switch is in the non-conductive state. Thus one signal can control both power switches of one phase in a simple manner.

As shown in FIG. 1, the comparator 4 output is connected to the second input poles of the gate drivers. Thus the second input poles of all gate drivers receive the same signal.

The switching sequences formed in the apparatus according to the invention are connected to the first input pole In of the phase-specific gate drivers 6 as illustrated in FIG. 1. If the signal simultaneously arriving at the second outputs $\overline{SD}$ from the comparator is up, the state of the switches controlled by the gate drivers accurately corresponds to the phase-specific switching sequences. In that case, the inverter generates voltage for the motor phases whose wave form is the same as the waveform produced by the means 2, and the phase shift between the phases corresponds to the phase shift produced by the means 5.

The control of the voltage effective value is implemented according to the invention by temporarily switching all switching components of the inverter part to a non-conductive state. The comparator 6 output connected to the second input poles of the gate drivers controls the voltage effective value in the manner described above. The comparator is used to compare the triangular curve form to the control variable, which is the control voltage produced by the NTC resistor, for instance. When the temperature of the object to be cooled is low, the value of the control variable, e.g. the control voltage, is high is relation to the triangular curve form. When the control variable intersects with the triangular curve form, the comparator changes its output to zero for the intersection. On the other hand, the gate drivers connected to the comparator output open all switches simultaneously, in which case the effective value of the motor voltage decreases. The lower the temperature of the object to be cooled is, the higher the control value is and the longer the gate drivers keep all switches open. In the case illustrated in FIG. 7, the control variable increases and at the same time the effective value of the motor voltage starts to decrease. In the figure, the control variable 72 intersects with the triangular signal 71 for the first time at moment t1, when the output signal 73 of the comparator shifts down, and as a result of this, all switching components of the inverter are controlled to the non-conductive state.

Correspondingly, when the temperature of the object to be cooled increases, the control variable, which has preferably been changed for the control voltage, decreases and thus the control voltage intersects with the triangular curve form for a shorter duration than above. This leads to an increase in the effective value of the voltage to be fed to the motor. When the control voltage is totally lower than the voltage produced by the triangular oscillator circuit 1, the comparator output is constantly up and thus the motor controlled by the inverter part receives all the voltage that is generated. As stated above, the level of the triangular signal can be shifted by means of component choices of the oscillator circuit in a simple manner.

FIG. 5 illustrates exemplary switching of the gate driver in respect of phase W. In the circuit of FIG. 5, the comparator output is supplied to input 52 and the phase-specific control sequence Ws to input 51. Output 53 is the output voltage of the phase which is connected to the respective phase of the motor to be controlled.

The control of the voltage effective value described above is performed simultaneously with the voltage frequency control. In that case, the motor is controlled by increasing the frequency of the supply voltage and the effective value of the voltage or decreased simultaneously. Using the above-mentioned components and voltage level choices, the field weakening point of the motor can be controlled to a higher rotation speed than what can be achieved by the network frequency.

The invention was described above as implemented by an apparatus where commercially available components had been used. It is, however, obvious that the features of the invention can also be implemented by circuits made of discrete components with the same function. The solution described is, however, the cheapest solution in terms of costs.

It is obvious to a person skilled in the art that as technology advances, the inventive concept can be implemented in various ways. The invention and its embodiments are thus not limited to the examples described above but they may vary within the scope of the claims.

What is claimed is:

1. A method of controlling a fan motor which is arranged to cool a substantially closed structure to be cooled, and arranged to be controlled by an inverter whose output is connected to the fan motor and which comprises output switching components, zero diodes connected in parallel with them and gate drivers, which are arranged to control the switching components of the inverter output according to switching instructions, the method comprising the steps of determining the temperature of the object to be cooled or a variable proportional to the temperature to form a control variable, controlling the frequency of the inverter output voltage on the basis of the control variable, and controlling the effective value of the inverter output voltage on the basis of the control variable, wherein the control of the effective value of the inverter output voltage comprises a step where common control information is produced for the gate drivers on the basis of a control signal, the control information being used for controlling the switching components of the inverter output to a non-conductive state.

2. A method according to claim 1, wherein the control information common to the gate drivers is a pulse width modulated signal which is supplied to the gate drivers so that the switching components can be controlled to the non-conductive state and kept in the non-conductive state depending on the pulses of the pulse width modulated signal.

3. A method according to claim 1, wherein the lower the determined temperature or a variable proportional thereto, the longer is the control information common to the gate drivers used to control the switching components of the input to the non-conductive state.

4. A method according to claim 1 where the fan motor comprises three-phase winding, wherein the control of the inverter output frequency and the effective value comprises the steps of forming phase-specific switching sequences for the switching components of the inverter output, the frequency of the sequences being responsive to the control variable, forming switching instructions depending on the pulse form of the phase-specific switching sequences and the control variable, and controlling the switching components according to the switching instructions and the control information common to all gate drivers.

5. A method according to claim 4, wherein the forming of the switching sequences for the switching components comprises the step of forming a pulse sequence whose pulse ratio is essentially one and whose frequency changes as the determined control variable changes, and forming phase-specific switching sequences from the formed pulse sequence so that the frequency of each phase-specific switching sequence is the same and the phase shift between the phase-specific switching sequences is 120°.

6. A method according to claim 4, wherein the control of switching components according to the switching instructions comprises a step where the switching components are controlled by the gate drivers.

7. An apparatus for controlling a fan motor, which is arranged to cool a substantially closed structure to be cooled, and arranged to be controlled by an inverter whose output is connected to the fan motor and which comprises output switching components, zero diodes connected in parallel with them and gate drivers, which are arranged to control the inverter output switching components according to switching instructions, the apparatus comprising means for forming a control variable on the basis of the temperature of the object to be cooled or a variable proportional to the temperature, means for controlling the frequency of the inverter output voltage on the basis of the control variable, and means for controlling the effective value of the inverter output voltage on the basis of the control variable, wherein the means for controlling the effective value of the inverter output voltage comprise means which produce common control information for the gate drivers on the basis of a control signal, the control information being used for controlling the switching components of the inverter output to a non-conductive state.

8. An apparatus according to claim 7, wherein the means for producing control information common to the gate drivers produce a pulse width modulated signal which is supplied to the gate drivers so that the switching components can be controlled to the non-conductive state and kept in the non-conductive state depending on the pulses of the pulse width modulated signal.

9. An apparatus according to claim 7, wherein the means for producing common control information comprise a comparator circuit and an oscillator circuit, which is arranged to produce a triangular voltage signal, the comparator circuit being arranged to compare the control variable to the triangular voltage produced by the oscillator circuit and, as a result of the comparison, produce a pulse width modulated signal for use as common control information.

10. An apparatus according to claim 7, wherein the means for controlling the inverter output frequency and the effective value comprise means for forming phase-specific switching sequences for the switching components of the inverter output, the frequency of the sequences being responsive to the control variable, means for forming switching instructions depending on the pulse form of the phase-specific switching sequences and the control variable, and means for controlling the switching components according to the switching instructions.

11. An apparatus according to claim 10, wherein the means for forming phase-specific switching sequences for switching components comprise means for forming a pulse sequence whose pulse ratio is substantially one and whose frequency changes as the determined control variable changes, and means for forming phase-specific switching sequences from the formed pulse sequence so that the frequency of each phase-specific switching sequence is the same and the phase shift between the phase-specific switching sequences is 120 °.

12. An apparatus according to claim 7, wherein the gate drivers comprise first inputs (In) to which phase-specific switching sequences are connected, and second inputs (SD) to which the control information common to all gate drivers is connected, in which case the control information common to all gate drivers can be used to control all switching components of the output to the non-conductive state so that the effective value of the output voltage can be controlled to the non-conductive state.

* * * * *